United States Patent [19]

Curtis et al.

[11] Patent Number: 4,499,175
[45] Date of Patent: Feb. 12, 1985

[54] PHOTOPOLYMERIZABLE MATERIALS FOR USE IN PRODUCING SCREEN PRINTING STENCILS

[75] Inventors: John R. Curtis, Salisbury; John D. Renwick, Ramsgate, both of England

[73] Assignee: Sericol Group Limited, London, England

[21] Appl. No.: 421,270

[22] Filed: Sep. 22, 1982

[30] Foreign Application Priority Data

Nov. 3, 1981 [GB] United Kingdom ............... 8133096

[51] Int. Cl.$^3$ ..................... G03C 7/12; G03C 1/70; G03F 5/00
[52] U.S. Cl. ..................... 430/253; 430/308; 430/286; 430/285; 430/284; 430/283; 430/922; 430/919; 430/281; 204/159.15; 204/159.24
[58] Field of Search ............... 430/286, 283, 284, 285, 430/280, 281, 282, 253, 308, 922, 919; 204/159.14, 159.15, 159.16, 159.17, 159.22

[56] References Cited

U.S. PATENT DOCUMENTS

| | | | |
|---|---|---|---|
| 3,448,089 | 6/1969 | Celeste | 430/306 |
| 3,510,303 | 5/1970 | Preddy et al. | 430/308 |
| 3,718,473 | 2/1973 | Gervay et al. | 430/281 X |
| 3,726,677 | 4/1973 | Hepher et al. | 430/308 X |
| 4,252,888 | 2/1981 | Rohloff | 430/286 |
| 4,262,084 | 4/1981 | Kinney | 430/308 |
| 4,287,039 | 9/1981 | Buethe et al. | 204/159.19 |
| 4,360,541 | 11/1982 | Costanza et al. | 204/159.22 X |
| 4,418,138 | 11/1983 | Curtis | 430/922 X |

FOREIGN PATENT DOCUMENTS

| | | |
|---|---|---|
| 0008146 | 1/1981 | Japan ................ 430/308 |
| 1351475 | 5/1974 | United Kingdom . |
| 1408466 | 10/1975 | United Kingdom . |
| 1426890 | 3/1976 | United Kingdom . |
| 1508315 | 4/1978 | United Kingdom . |
| 1571191 | 7/1980 | United Kingdom . |

OTHER PUBLICATIONS

Vazirani et al., "UV-Cured Epoxy-Acrylate Coatings on Optical Fibers 1. Chemistry and Application", *Journal of Radiation Curing*, Oct. 1977, pp. 18–19, vol. 4, No. 4.

James F. Field, "The Chemistry of Ultraviolet Cured Printing Inks", *Radiation Curing*, May 1979, vol. 6, No. 2, pp. 14–15.

Van Landuyt et al., "Physical and Electrical Properties of Acrylic Oligomers", *Radiation Curing*, vol. 9, No. 2, May 1982, p. 10.

Technical Bulletin, "SR-259 Polyethylene Glycol 200 Diacrylate", Sartomer Company, West Chester, Pa., one p., revised Mar. 1973.

"Radiation Curing: Product Bulletin: Photomer AM 528", Diamond Shamrock, Industrial Chemicals Division, Manchester, England, 1 p.

"polyethylene glycol ester", *Condensed Chemical Dictionary*, 9th ed. revised by G. G. Hawley, (Van Nostrand Rheinhold Co., 1977), p. 699.

Primary Examiner—John E. Kittle
Assistant Examiner—Cynthia Hamilton
Attorney, Agent, or Firm—Cushman, Darby & Cushman

[57] ABSTRACT

Aqueous compositions useful in making stencils for screen printing comprise a solution of an unsaturated prepolymer dispersed in an aqueous solution of a colloid, and a photo-initiator. Such compositions may be coated on suitable support sheets to produce photosensitive sheets useful for making stencils for screen printing by the direct, indirect, or direct/indirect methods.

22 Claims, No Drawings

PHOTOPOLYMERIZABLE MATERIALS FOR USE IN PRODUCING SCREEN PRINTING STENCILS

DESCRIPTION

This invention relates to aqueous compositions for use in making stencils for screen printing.

In screen printing, two main photosensitive stencil systems are used. In the first, the so-called "indirect method", a photosensitive composition is coated on to a transparent polymeric backing support, usually of a polyester material. The coated support can be irradiated with actinic light through a positive transparency after which, depending on the type of photopolymerisation system used, the image obtained can be developed with water, or activated with a per-compound and then developed with water. The wet image on its polymeric backing support is then adhered to the screen mesh by application of gentle even pressure and, after drying, the polymeric support sheet is removed leaving the photopolymerised image on the screen mesh ready for printing.

In the second system, the so-called "direct method", a stencil image is produced on a screen mesh by photo-sensitising a water-soluble cross-linkable colloid with a suitable photo-crosslinker which can be a dichromate compound or a polymeric diazonium salt, and then coating the colloid onto the screen mesh. When sensitised in this manner the coated layer on the screen mesh, after drying, can be exposed to actinic light through a suitable positive transparency to produce a latent image. On development of the image with water, the areas irradiated by the actinic light remain as they have become insoluble in water, while the areas protected from the actinic light, which still retain the original water-solubility of the water-soluble colloid, are washed away to leave an image which, after drying, is ready for printing.

Both the above methods of producing stencil images on a screen mesh have serious drawbacks. In the first method, when the system relies on photo-initiators of the ferric salt type, it has to undergo a treatment with a per-compound e.g. hydrogen peroxide, to cause free radicals to be formed which initiate photopolymerisation of the monomers present and cause insolubilisation of the layer. After this activation step, normal water development follows to give the image. The other method relies on a leuco sulphuric ester of an indigo or thio-indigo dye as the photo-initiator which requires the presence of moisture to remain active. This necessitates the use of quite large quantities of humectants in the formulation so that the material will function correctly in hot dry climates. These humectants create problems in high humidity areas and can cause reticulation of the film when it is removed from its sealed container. Their presence also tends to reduce the mechanical strength of the carrier colloid (usually polyvinyl alcohol), resulting in shorter print runs with the finished stencil.

The direct system suffers the drawback that the material is usually of a Two Pack variety which requires both a sensitiser and a base emulsion which on sensitising has a useful pot life of a matter of days when the sensitiser is a dichromate and a maximum of three months when the sensitiser is a polymeric diazo salt.

Another disadvantage in the above methods for producing stencil images on a screen is that after exposure there is very little contrast between the exposed and unexposed areas so that there is no satisfactory way of inspecting the image before the development stage. This means that if the art work is faulty, or the positioning of the positive is incorrect, the fault goes unnoticed until after the final stencil image has been produced.

The present invention is based on the discovery that a prepolymer containing polymerisable unsaturation in the form of terminally ethylenically unsaturated entities which are part of ester, amide or urethane functions chemically attached to, or part of, the aforementioned prepolymer, when dissolved in a solvent or mixture of solvents, e.g. a suitable vinyl/acrylic monomer or mixture of monomers, and initiated with conventional UV ink photo-initiators can, with the use of suitable surfactants, be successfully dispersed in a water-soluble colloid to produce a stable emulsion which when coated on a support sheet or screen mesh can be exposed to ultra violet light via a positive transparency and developed in water to produce a relief or stencil image. Because the prepolymer is dispersed in an aqueous solution of a water-soluble colloid, the exposed coated stencil can be developed with water and the use of relatively expensive and often toxic and/or inflammable organic solvents thereby avoided. Nevertheless, use of the specified prepolymers makes it possible to obtain tough and durable screen stencils superior to those obtainable with water-soluble prepolymers.

In a preferred embodiment of the invention the coating is coloured in such a way that after exposure there is an easily visible colour difference between the exposed and the non-exposed areas. The production of a visible and highly contrasted latent image immediately upon exposure to actinic light enables the stencil maker in the process of exposing a number of screen stencils at about the same time to know whether a given screen has been exposed or not. For instance, if his work is interrupted, or where a large single stencil screen is exposed a number of times, for example in the so-called 'step and repeat process' of preparing screen printing stencils, the operator is able to ascertain immediately which areas have been exposed. Also, where multiple exposures are required, the visible image of the first exposure may act as a guide for registration of subsequent exposures.

A photosensitive emulsion, applied to a screen mesh in any of the aforementioned methods, which is capable of producing a visible image upon exposure, prior to any subsequent development or treatment thereof, has also the advantage of vividly showing up screens that have been exposed by accident ("fogged" by exposure to stray sunlight or artificial light).

According to the present invention, an aqueous photopolymerisable composition comprises a solution of a prepolymer containing terminal ethylenic unsaturation joined to the remainder of the molecule via ester, amide or urethane linkages, the said solution being dispersed in an aqueous solution of a colloid, and the composition comprising also a photo-initiator.

Additionally, solvent- or water-soluble resins which can cross-link on stoving or acid catalysis can be added to the compositions as diluents. Such resins include aminoplast resins, alkyd resins, polyester resins, epoxy resins, blocked isocyanate resins, polyurethane resins and polyurethane/alkyd resins. These are normally dissolved in the solvent phase of the new compositions before the solvent is dispersed in the aqueous solution of the water-soluble colloid. The presence of these resins with their ability to cross-link with the colloid, with themselves, or with other resins present in the composition, when either stoved or acid catalysed adds to the chemical and physical resistance of the final image after the heating or acid catalysis step has been completed. This is turn leads to an increase in the useful range of application of the product.

When used to produce indirect stencils, the new compositions do not suffer the drawback of requiring an "activation" step in a solution of peroxide or equivalent substance or have the disadvantage of having to contain quite large quantities of humectant. In the "wet" emulsion form they do not require sensitisation by a separate sensitising component and hence offer the simplicity and convenience of a one-pack system. They have a further advantage in that the use of the unsaturated prepolymer in the formulation adds strength and adhesion to the final exposed and developed image, providing good durability under the stresses of printing.

The unsaturated prepolymer can be included in the formulation at a widely varying ratio to the water-soluble colloid, thus providing a range of physical and chemical resistance properties which effectively increases the range of uses of the product.

In the new compositions, the prepolymer may be dissolved in a photochemically inactive solvent or mixture of solvents or in a photopolymerisable solvent or mixture thereof. The resulting prepolymer solution in either photopolymerisable or non-photopolymerisable solvent, and optionally containing a non-photopolymerisable resin, is dispersed in the aqueous solution of the water-soluble colloid with the aid of suitable surfactants to form a stable emulsion. The composition may also include pigments or dyes (or their precursors) to provide a visible image and inert fillers such as starch, kaolin, titanium dioxide, polytetrafluoroethylene or silica to prevent surface stickiness or promote slip, plus suitable tertiary nitrogen containing organic bases to act as accelerators, and plasticisers to aid flexibility.

The prepolymers used in the present invention should be such as to give on photopolymerisation a tough flexible, and insoluble resin. The preferred prepolymers are those obtained by reacting an aromatic polyester, epoxy or urethane prepolymer having hydroxy and/or epoxy groups with a terminally unsaturated acid (or ester thereof), preferably of 3 to 5 carbon atoms, to form unsaturated ester groupings by reaction with hydroxy or epoxy groups present in the prepolymer. The proportion of prepolymer is normally 5 to 35%, and preferably 7 to 20%, by weight of the composition.

The solvent for the prepolymer may be inert (non-polymerisable) or photopolymerisable. The preferred inert solvent is an ester of the formula: $R-O-(CH_2CH_2O)_n CO-R^1$ where R is methyl or ethyl, n is 1 or 2, and $R^1$ is methyl, ethyl, isopropyl, or n-propyl. However other solvents or solvent mixtures which dissolve the unsaturated prepolymer and form a stable dispersion or emulsion in the water-soluble colloid solution may be used. Preferred photopolymerisable solvents are mono- di- or tri-functional terminally ethylenically unsaturated monomers or mixtures thereof capable of producing a true solution with the unsaturated prepolymer and forming a stable emulsion or dispersion in the water-soluble colloid solution. Examples of such solvents are hexane diol diacrylate, N-vinyl-pyrrolidone, polyethylene glycol (200) diacrylate, triethylene glycol diacrylate, tripropylene glycol diacrylate, tetraethylene glycol diacrylate, and trimethylolpropane triacrylate. It can be advantageous to mix photopolymerisable monomers to produce the desired properties of speed and flexibility in the final coating. The proportion of solvent is normally 2 to 15%, and preferably 4 to 10%, by weight of the composition.

The aqueous colloid solution preferably contains a surfactant. The surfactant may be nonionic or anionic with a suitable HLB (hydrophilic/lipophilic balance) and emulsifying power to hold the dissolved prepolymer phase as a stable emulsion in the water-soluble colloid solution. The preferred surfactants are polyoxyethylenated alkylphenols. However, any suitable surfactant capable of stabilising the emulsion can be used. The proportion required is small, usually less than 1% of the weight of the composition.

The preferred photo-initiators are those which have absorptions above 325 nm, e.g. thioxanthone derivatives, substituted benzophenones and 1,1-dimethoxyacetophenone. However, any photo-initiator that is soluble in, and compatible with, the compositions of the invention and capable of forming free radicals on irradiation with actinic light of the appropriate wavelength can be used. The proportion is usually 0.5 to 5%, and preferably 1.5 to 3.5%, by weight of the composition.

Suitable accelerators or secondary initiators may be compounds containing at least one tertiary nitrogen atom and at least one aliphatic alcohol function, or compounds containing at least one tertiary nitrogen atom and at least one terminally ethylenically unsaturated group which is part of an ester or amide function. Compounds of the first type include methyl-diethanolamine, and of the second type include Uvecryl P101 (a trade mark or UCB).

The proportion of accelerator is not usually greater than 5% and is preferably 1.5 to 3% by weight of the composition.

The preferred plasticisers, when such are used, are glycols, glycerol esters and phthalate esters. However, any compatible plasticiser may be used, usually in a proportion of not more than 10% of the weight of the composition, and preferably 3.5 to 7%.

Suitable water-soluble colloids include polyvinyl alcohol, polyvinyl pyrrolidone, gelatin, hydroxyethyl cellulose and hydroxypropyl cellulose. Such colloids are not insolubilised (on irradiation) by the photoinitiator alone, but only by the combination of the photoinitiator and the polymerisable prepolymer. The aqueous solution of the colloid is ordinarily not more than 92% by weight of the composition of which the colloid is 3 to 12%, preferably 5 to 9%, and the water is 30 to 80%, preferably 50 to 65%, by weight of the composition.

The photosensitive composition may also include dyes or pigments to render the final image visible. The initial coating can be coloured to provide visible images or the photopolymerised layer can be treated with a colouring solution after processing. In this connection it is especially preferred to include in the new compositions a thioindigoid or indigoid dyestuff, e.g. of the Anthrasol series (Hoechst). Such dyestuffs have the valuable property mentioned above that, in the presence of the free radical photoinitiator and a suitable water-soluble plasticiser for the water-soluble colloid, they change colour on exposure to actinic light to produce a clearly visible contrast between the light-struck and non-light struck areas. Such dyestuffs have the additional advantage of acting as an additional photoinitiator (provided at least the dried composition contains sufficient moisture).

Extenders or fillers such as starch, silica, polytetrafluoroethylene powder, titanium dioxide or kaolin may be used to increase the solids content of the composition, and to improve coating properties, e.g. to prevent surface stickiness. Up to 10% by weight of the composition, usually 3 to 7%, by weight may be included.

Any additional, non-photopolymerisable resin present in the photopolymerisable composition can be an aminoplast resin, e.g. a urea-formaldehyde, melamine-formaldehyde, benzoguanamine, or glycoluril resin, an alkyd resin, e.g. a medium or short oil length or semi-drying resin, an epoxy resin, e.g. a liquid or semi-liquid Bis-phenol A or epoxy-novolac resin, blocked isocyanate resin, or a polyurethane resin. Such resins should be soluble in, and compatible with, the photopolymerisable phase on the aqueous colloid phase. The proportion may be up to 20% by weight of the composition, but is preferably not more than the weight of the prepolymer.

In use, the compositions of the invention may be coated on an appropriate support, normally a printing screen or a flexible transparent film, and dried. The coating so obtained is then irradiated, after which the unpolymerised (unexposed) areas of the layer are removed, e.g. by dissolution in warm water.

The actinic radiation may be natural light or light derived from a carbon arc lamp, a xenon arc lamp, a high intensity mercury lamp, or a tungsten filament lamp.

The images formed by photopolymerisation using the compositions of the invention can be used for preparing stencils for screen printing either by the direct or indirect method, or in any photographic or photomechanical process where resists, stencils or relief images are required, for example in making etching resists for printing plates, name plates, dials or circuit patterns, ink-accepting images for lithographic masters, or negative stencils for positive reversal litho systems. The images can also serve as dye resists and printing matrices as well as visually coloured displays in reflective or transparent form. The suitability of the image for a specific application is conditioned by the choice of the colloid and prepolymer components, as well as any unsaturated monomer or non-photopolymerisable resin which may be present.

The following Examples illustrate the invention.

EXAMPLE 1

The following emulsion was coated on a 62 threads to the cm screen mesh applying 3 coats wet on wet to each side of the mesh.

| | Weight |
|---|---|
| 15% aqueous solution of GM14L (Nippon Gohsei)[1] | 50.0 g |
| Benzophenone | 4.5 |
| Diethylaminoethanol | 1.5 |
| Polyethyleneglycol 200 diacrylate | 7.0 |
| Anthrasol Pink IR (Hoechst) | 1.0 |
| Deionised water | 30.0 |
| *Photomer 3016 (Lankro)[2] (70% in β-ethoxyethyl acetate) | 100.0 |
| Kaolin | 6.5 |
| Dibutyl phthalate | 2.0 |
| Quantacure SKS (Ward Blenkinsop) photo-intiator[3] | 0.3 |
| β-Ethoxyethyl acetate | 15.0 |

[1] A medium molecular weight 88% hydrolysed polyvinyl alcohol (12% residual acetate)
[2] Epikote 828 Diacrylate. Epikote 828 is an epoxy resin having a molecular weight of about 182-194 per epoxy group. (Epikote is a trademark of Shell).
[3] Quantacure SKS is sulphomethyl-benzil.

The coating was dried and exposed through a photographic positive transparency to a 800 watt mercury halide (Thorn) lamp at a distance of 1 meter for 420 seconds. The latent image appeared colourless against a pink background. After washing with cold water, a relief stencil image was obtained. The coating was colourless before exposure.

An emulsion similar to the above but omitting the acrylate prepolymer and monomer was made up and coated using the following emulsion.

| | Weight |
|---|---|
| 15% aqueous solution of GM14L (Nippon Gohsei)[1] | 50.0 g |
| Benzophenone | 4.5 |
| Diethylaminoethanol | 1.5 |
| Anthrasol Pink IR (Hoechst) | 1.0 |
| Deionised water | 30.0 |
| Kaolin | 6.5 |
| Dibutyl phthalate | 2.0 |
| β-Ethoxyethyl acetate | 15.0 |

The coating was dried and exposed to a 800 watt mercury halide lamp at a distance of 1 meter for 20 minutes. On washing the whole coated layer was removed. This indicates that no useful insolubilisation of the layer occurs in the absence of the unsaturated prepolymer.

EXAMPLE 2

| | Weight |
|---|---|
| 15% aqueous solution of GM14L (Nippon Gohsei)[1] | 50.0 g |
| Irgacure 651 (Ciba-Geigy) Photoinitiator[4] | 4.5 |
| Anthrasol Grey IBL (Hoechst) | 1.0 |
| **Berol 02 (Berol Kemi) surfactant[5] | 2.0 |
| Polyethylene glycol 200 | 6.0 |
| Diethylaminoethanol | 1.3 |
| Kaolin | 6.0 |
| Dibutyl phthalate | 2.5 |
| Photomer 3016 (Lankro)[2] (70% in β-ethoxyethyl acetate) | 95.0 |
| Deionised water | 25.0 |

[4] Irgacure 651 is benzil dimethylketal
[5] Berol 02 is a polyoxyethylenated alkylphenol The emulsion was coated as in Example 1, dried and exposed through a photographic positive transparency to a 800 watt mercury halide lamp at a distance of 1 meter for 300 seconds. The image appeared colourless against a grey-blue background. After washing with cold water, a relief stencil was obtained. The unexposed coating was colourless.

EXAMPLE 3

| | Weight |
|---|---|
| Photomer 3016 (Lankro)[2] 80% in hexanediol diacrylate | 47.0 g |
| Trimethylol propane triacrylate | 3.0 |
| Synperonic NP8 (ICI)[6] | 3.0 |
| β-Ethoxyethyl acetate | 8.0 |

| | Weight |
|---|---|
| Uvecryl P36 (UCB) Photoinitiator[7] | 0.7 |
| Anthrasol Blue Black IRD (Hoechst) | 1.0 |
| Kaolin | 3.5 |
| 11% aqueous solution of Gohsenol KPO8 (Nippon Gohsei)[8] | 74.0 |
| Polyethylene glycol 200 | 3.0 |
| Triethanolamine | 3.0 |
| Surfynol 104 (Air Products) surfactant[9] | 1.0 |

[6]A polyoxyethylenated alkyl-phenol surfactant
[7]Uvecryl P36 is an unsaturated copolymerisable benzophenone (from UCB, SA, Belgium)
[8]Gohsenol KPO8 is polyvinyl alcohol of 25 to 29% residual acetate content (from Nippon Gohsei, Osaka, Japan)
[9]An alkyne diol surfactant This emulsion was coated on a 90 HDA (Heavy duty amber) screen mesh applying 3 coats to the print side of the mesh and 1 coat to the squeegee side. The coating was dried to give a colourless layer, and exposed through a photographic positive transparency to a 800 watt mercury halide lamp at a distance of 1 meter for 50 seconds. The latent image appeared green against a dark purple background. After washing with cold water, a relief stencil image was obtained.

EXAMPLE 4

| | Weight |
|---|---|
| Photomer 3016 (Lankro)[2] 80% in N—Vinyl-pyrrolidone | 54.0 g |
| Soalkyd 7770 (Berol Kemi)[10] | 6.0 |
| Uvecryl P36 (UCB) Photoinitiator[7] | 2.0 |
| Kaolin | 4.0 |
| Anthrasol Pink IR (Hoechst) | 0.5 |
| N—Ethyl-diethanolamine | 1.5 |
| Irgalite Blue CPV 50% in water (Ciba Geigy) | 0.8 |
| Synperonic NP8 (ICI)[6] | 0.05 |
| 14% aqueous Gohsenol KPO8 (Nippon Gohsei)[8] | 60.0 |

[10]Soalkyd 7770 is a high acid value water-reducible alkyl resin.

This emulsion was coated on a 120 HDA screen mesh applying 3 coats to the print side and 2 to the squeegee side. The coating was dried to give a pale blue layer and exposed through a photographic positive transparency to a 800 watt mercury halide lamp at a distance of 1 meter for 360 seconds. The latent image appeared pale blue against a purple background. The resultant exposed screen was allowed to soak in water for 5 minutes and then was washed out with a cold water spray to leave a relief stencil image.

EXAMPLE 5

| | Weight |
|---|---|
| Photomer 3016 (Lankro)[2] 80% in hexane diol diacrylate | 65.0 g |
| Isobutylated melamine/formaldehyde resin (BE687 of B.I.P. Ltd) | 17.0 |
| Trimethylol propane triacrylate | 3.5 |
| Synperonic NP8 (ICI)[6] | 4.0 |
| Dibutyl phthalate | 2.5 |
| Irgacure 651 (Ciba-Geigy) Photoinitiator[4] | 1.0 |
| Quantacure ITX (Ward Blenkinsop) Photoinitiator[11] | 0.5 |
| Anthrasol Pink IR (Hoechst) | 2.0 |
| Kaolin | 5.0 |
| 13% KPO8 solution (Nippon Gohsei)[8] | 75.0 |
| Deionised water | 10.0 |
| Polyethylene glycol 200 | 5.0 |
| N—Methyl-diethanolamine | 4.5 |
| Surfynol 104 (Air Products) Surfactant[9] | 1.0 |
| 50% Helizarin Blue RT (BASF) | 1.0 |

[11]Quantacure ITX is 2-isopropyl-9H—thioxanthen-9-one (Ward Blenkinsop and Co. Ltd., Wembley, Middlesex, England.

This emulsion was coated on a 77 HDA screen mesh applying 3 coats to each side of the fabric. The coating was dried and exposed through a photographic positive to a 800 watt mercury halide lamp at a distance of 1 meter for 100 seconds. The latent image appeared pale blue against a purple background. After washing with cold water, a relief stencil image was obtained.

EXAMPLE 6

| | Weight |
|---|---|
| Photomer 3016 (Lankro)[2] 80% in hexane diol diacrylate | 51.0 g |
| Trimethylolpropane triacrylate | 3.0 |
| Synperonic NP8 (ICI)[6] | 3.0 |
| Uvecryl P36 (UCB) Photoinitiator[7] | 0.7 |
| Anthrasol Pink IR (Hoechst) | 1.2 |
| Kaolin | 3.5 |
| 50% Helizarin Blue RT (BASF) | 0.5 |
| 11% aqueous KPO8 solution (Nippon Gohsei)[8] | 120.0 |
| Triethanolamine | 3.0 |
| Surfynol 104 (Air Products) Surfactant[9] | 3.0 |
| β-Ethoxyethyl acetate | 8.0 |

This emulsion was coated on a 14TT mesh applying 3 coats to the print side and 1 coat to the squeegee side. The coating was dried to give a pale blue layer and exposed through a photographic positive transparency to a 800 watt mercury halide lamp at a distance of 1 meter for 60 seconds. The latent image appeared pale blue against a purple background. After washing with cold water, a relief stencil image was obtained.

We claim:

1. In a method for producing a stencil for screen printing by forming a layer of an aqueous photopolymerizable composition, drying the said layer, irradiating the dried layer with actinic light in image-wise manner to form an insolubilzed image in the said layer and developing the said insolubilized image by washing out unirradiated portions of the said layer, the said layer being formed directly on the printing screen or on a support sheet and then transferred to the printing screen before or after the said development, the improvement which consists in forming the said layer from an aqueous photopolymerizable composition in the form of a dispersion, in an aqueous solution of a colloid, of a solution of a prepolymer containing terminal ethylenic unsaturation joined to the residue of an aromatic polyester, epoxy or urethane prepolymer via ester, amide or urethane linkages, the said composition containing also a photoinitiator, whereby the insolubilized image may be developed by washing out unirradiated portions of the said layer with water.

2. A method according to claim 1 in which the prepolymer is an aromatic urethane prepolymer or aromatic polyester resin having hydroxy groups esterified by an ethylenically unsaturated acid of 3 to 5 carbon atoms.

3. A method according to claim 1 in which the prepolymer is an aromatic epoxy resin having hydroxy and/or epoxy groups esterified by an ethylenically unsaturated acid of 3 to 5 carbon atoms.

4. A method according to claim 1 in which the proportion of prepolymer is 5 to 35% by weight of the composition.

5. A composition according to claim 1 in which the prepolymer is dissolved in an ester of the formula:

$$R-O-(CH_2CH_2O)_{\overline{n}}CO-R^1$$

where R is methyl or ethyl, n is 1 or 2 and $R^1$ is methyl, ethyl, isopropyl or n-propyl.

6. A method according to claim 1 in which the prepolymer is dissolved in a photopolymerisable ethylenically unsaturated solvent.

7. A method according to claim 6 in which the solvent is hexanediol diacrylate, N-vinyl-pyrrolidone, polyethylene glycol (200) diacrylate, triethylene glycol diacrylate, tripropylene glycol diacrylate, tetraethylene glycol diacrylate, or trimethylolpropane triacrylate.

8. A method according to claim 6 in which the solvent for the prepolymer constitutes 2 to 15% by weight of the composition.

9. A method according to claim 1 in which the photo-initiator is a thioxanthone or benzophenone derivative, or 1,1-dimethoxy-acetophenone.

10. A method according to claim 9 in which the proportion of the photo-initiator is 0.5 to 5% by weight of the composition.

11. A method according to claim 1 in which the water in the aqueous solution of the colloid is 30 to 80% by weight of the composition and the colloid is 3 to 12% by weight of the composition.

12. A method according to claim 13 in which the accelerator is an ethylenically unsaturated monomer containing a tertiary nitrogen atom or a tertiary amino-alcohol.

13. A method according to claim 1 in which the said composition contains an organic nitrogen base as accelerator.

14. A method according to claim 1 in which the said composition also contains a non-photopolymerisable aminoplast, alkyd, epoxy, blocked isocyanate, or polyurethane resin.

15. A method according to claim 1 in which the said composition also contains a water-soluble surfactant.

16. A method according to claim 1 in which the said composition also contains a plasticiser, filler and/or colourant.

17. A method according to claim 1 in which the said composition also contains a thioindigoid or indigoid dyestuff.

18. A method according to claim 13 in which the proportion of the accelerator is 1.5 to 3% by weight of the composition.

19. A method according to claim 15 in which the surfactant is a polyoxyethylenated alkyl-phenol.

20. A method of producing a stencil for screen printing which comprises:
    (a) coating a transparent and flexible support sheet with an aqueous photopolymerizable composition in the form of a dispersion, in an aqueous solution of a colloid, of a solution of a prepolymer containing terminal ethylenic unsaturation joined to the residue of an aromatic polyester, epoxy or urethane prepolymer via ester, amide or urethane linkages, the said composition comprising also a photoinitiator;
    (b) drying the said coating;
    (c) irradiating the coated sheet with actinic light in image-wise manner to form an insolubilized image in the said coating;
    (d) developing the insolubilized image in the irradiated coating by washing out unirradiated portions of the said coating with water; and
    (e) transferring the insolubilized image from the support sheet to a printing screen.

21. A screen for screen printing coated with an aqueous photopolymerisable composition in the form of a dispersion, in an aqueous solution of a colloid, of a solution of a prepolymer containing terminal ethylenic unsaturation joined to the residue of an aromatic polyester, epoxy or urethane prepolymer via ester, amide or urethane linkages, the said composition containing also a photo-initiator, and dried.

22. A method of producing a stencil for screen printing which comprises irradiating a coated screen as claimed in claim 21 with actinic light, and then developing the insolubilised image.

* * * * *